United States Patent
Nakamura et al.

(10) Patent No.: US 8,481,892 B2
(45) Date of Patent: Jul. 9, 2013

(54) CERAMIC HEATER AND METHOD FOR PRODUCING SAME

(75) Inventors: Keiichi Nakamura, Handa (JP); Kazuhiro Nobori, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 577 days.

(21) Appl. No.: 12/732,449

(22) Filed: Mar. 26, 2010

(65) Prior Publication Data
US 2010/0243635 A1 Sep. 30, 2010

(30) Foreign Application Priority Data
Mar. 30, 2009 (JP) ................. 2009-081594

(51) Int. Cl.
F23Q 7/00 (2006.01)
F23Q 7/22 (2006.01)

(52) U.S. Cl.
USPC ............................ 219/260; 219/267; 219/270

(58) Field of Classification Search
USPC .......................... 219/260, 267, 270
See application file for complete search history.

(56) References Cited

U.S. PATENT DOCUMENTS

| | | | | |
|---|---|---|---|---|
| 5,589,091 A | * | 12/1996 | Muller | 219/270 |
| 5,948,306 A | * | 9/1999 | Konishi et al. | 219/548 |
| 6,013,898 A | * | 1/2000 | Mizuno et al. | 219/270 |
| 6,225,606 B1 | | 5/2001 | Tsuruta et al. | |
| 7,126,090 B2 | | 10/2006 | Yamaguchi et al. | |
| 8,227,726 B2 | * | 7/2012 | Funaki et al. | 219/270 |
| 2001/0042746 A1 | * | 11/2001 | Tanaka et al. | 219/541 |
| 2002/0023914 A1 | | 2/2002 | Kitagawa et al. | |
| 2003/0130106 A1 | | 7/2003 | Yoshikawa et al. | |
| 2003/0146206 A1 | * | 8/2003 | Tanaka et al. | 219/541 |

FOREIGN PATENT DOCUMENTS

| | | |
|---|---|---|
| EP | 1 089 593 A2 | 4/2001 |
| JP | 11-204238 A1 | 7/1999 |
| JP | 2001-102157 A1 | 4/2001 |
| JP | 2001-313157 A1 | 11/2001 |
| JP | 2003-226580 A1 | 8/2003 |
| JP | 2003-288975 A1 | 10/2003 |

* cited by examiner

Primary Examiner — James Mitchell
(74) Attorney, Agent, or Firm — Burr & Brown

(57) ABSTRACT

A method for producing a ceramic heater includes performing firing at 1,600° C. to 1,750° C. in a state in which front and back surfaces of an inner shaped body composed of low-temperature sinterable raw material powder containing aluminum nitride powder as a main component and 0.03% to 1% by weight of rare earth oxide powder are sandwiched between a pair of outer layers composed of aluminum nitride sintered bodies having a volume resistivity of $10^{15}$ Ωcm or more through resistive heating elements composed of metal meshes, thereby obtaining a ceramic heater.

10 Claims, 5 Drawing Sheets

- Intermediate sintered body
- Interface
- Outer sintered body

- Intermediate sintered body
- Interface
- Outer sintered body

CERAMIC HEATER AND METHOD FOR PRODUCING SAME

BACKGROUND OF THE INVENTION

1. Field of the Invention

The present invention relates to a ceramic heater and a method for producing the same.

2. Description of the Related Art

In semiconductor manufacturing equipment, when a semiconductor thin film is formed by thermal CVD or the like on a wafer using a raw material gas, such as silane gas, a ceramic heater is used for heating the wafer. In the ceramic heater, it is necessary to maintain the temperature of the wafer-heating surface at a high temperature, for example, 700° C. In order to improve film-forming properties, yield, and product quality, it is required to control the temperature distribution on the wafer-heating surface in a very narrow range.

For example, Patent Document 1 discloses a ceramic heater including a resistive heating element composed of molybdenum embedded in an aluminum nitride sintered body, in which temperature uniformity on the heating surface is improved. Specifically, when aluminum nitride powder containing yttria powder is press-formed into a shaped body, a resistive heating element composed of molybdenum is embedded in the vicinity of the center of the shaped body, and disc-shaped or ring-shaped dummy members composed of molybdenum are embedded at positions closer to the upper and lower surfaces of the shaped body. The shaped body is sintered by hot pressing at 1,800° C. to obtain a sintered body, and the dummy members are removed from the sintered body by machining. Thereby, a ceramic heater is produced. In such a ceramic heater, molybdenum carbide is formed in the resistive heating element during sintering. When molybdenum carbide is unevenly distributed in the resistive heating element, the resistance increases thereby increasing the amount of heat generation at portions where molybdenum carbide is present. As a result, temperature uniformity on the heating surface is impaired. In Patent Document 1, by sintering the shaped body in which dummy members are embedded, formation of molybdenum carbide in the resistive heating element is controlled, and the change in resistance of the resistive heating element is suppressed. As a result, temperature uniformity on the heating surface is successfully improved.

PRIOR ART DOCUMENT

Patent Document

[Patent Document 1] Japanese Unexamined Patent Application Publication No. 2003-288975

However, in Patent Document 1 described above, the dummy members are removed by machining from the sintered body obtained by sintering the shaped body in which the dummy members are embedded. Therefore, the dummy members are required, and the cost of the dummy members is reflected in the ceramic heater, resulting in an expensive ceramic heater.

SUMMARY OF THE INVENTION

The present invention has been achieved in order to solve the problem described above. It is a main object of the invention to enhance temperature uniformity on the heating surface of a ceramic heater without using dummy members.

In order to achieve the main object described above, the present invention provides the followings:

In an aspect of the present invention, a method for producing a ceramic heater includes performing hot-press firing at 1,600° C. to 1,750° C. in a state in which front and back surfaces of an inner shaped body composed of low-temperature sinterable raw material powder containing aluminum nitride powder as a main component and 0.03% to 1% by weight of rare earth oxide powder are sandwiched between a pair of outer layers composed of aluminum nitride sintered bodies having a volume resistivity of $10^{15}$ Ωcm or more through resistive heating elements composed of metal meshes.

In another aspect of the present invention, a ceramic heater includes an intermediate sintered body containing, as a main component, aluminum nitride and having an average crystal grain size of 1 to 2 μm and a carbon content of 300 to 600 ppm (by weight), first and second resistive heating elements composed of metal meshes disposed on front and back surfaces of the intermediate sintered body, and a pair of outer sintered bodies containing, as a main component, aluminum nitride and having an average crystal grain size of 5 to 7 μm and a carbon content of 200 to 400 ppm (by weight), the carbon content being lower than the carbon content of the intermediate sintered body, the outer sintered bodies sandwiching the intermediate sintered body through the first and second resistive heating elements. Preferably, the outer sintered bodies contain a rare earth element, and the intermediate sintered body contains a smaller amount of a rare earth element than the outer sintered bodies. The outer sintered bodies preferably contain a rare earth element in an amount of 4% to 7% by weight, and the intermediate sintered body preferably contains a rare earth element in an amount of 0.03 to 1% by weight. The resistive heating elements are preferably composed of a material obtained by knitting molybdenum wires having a diameter of 0.1 to 0.2 mm. Furthermore, preferably, when the first and second resistive heating elements are heated to 700° C., the difference between maximum and minimum temperatures on the surface of the substrate is 5° C. or less.

In the method for producing a ceramic heater according to the present invention, it is possible to enhance temperature uniformity on the heating surface of a ceramic heater without using dummy members. That is, hot-press firing is performed at 1,600° C. to 1,750° C. in a state in which front and back surfaces of an inner shaped body is sandwiched between a pair of outer layers composed of aluminum nitride sintered bodies through resistive heating elements. Consequently, compared with the case where firing is performed by heating to 1,800° C. or higher, it is possible to reduce formation of the carbide phase having a high resistance and a large amount of heat generation in an unevenly distributed manner in the resistive heating elements, and to suppress a change in resistance of the resistive heating elements. Thus, temperature uniformity on the heating surface of the ceramic heater can be enhanced.

In the ceramic heater according to the present invention, current leakage does not occur between the first resistive heating element and the second resistive heating element, and temperature uniformity (hereinafter, referred to as "uniformity of heating") of the heating surface (surface of the substrate) is high. Therefore, the ceramic heater is suitable as a part of a film-forming apparatus for forming semiconductor thin films. Such a ceramic heater can be obtained by the method for producing a ceramic heater described above.

DETAILED DESCRIPTION OF THE INVENTION

Figure 1:
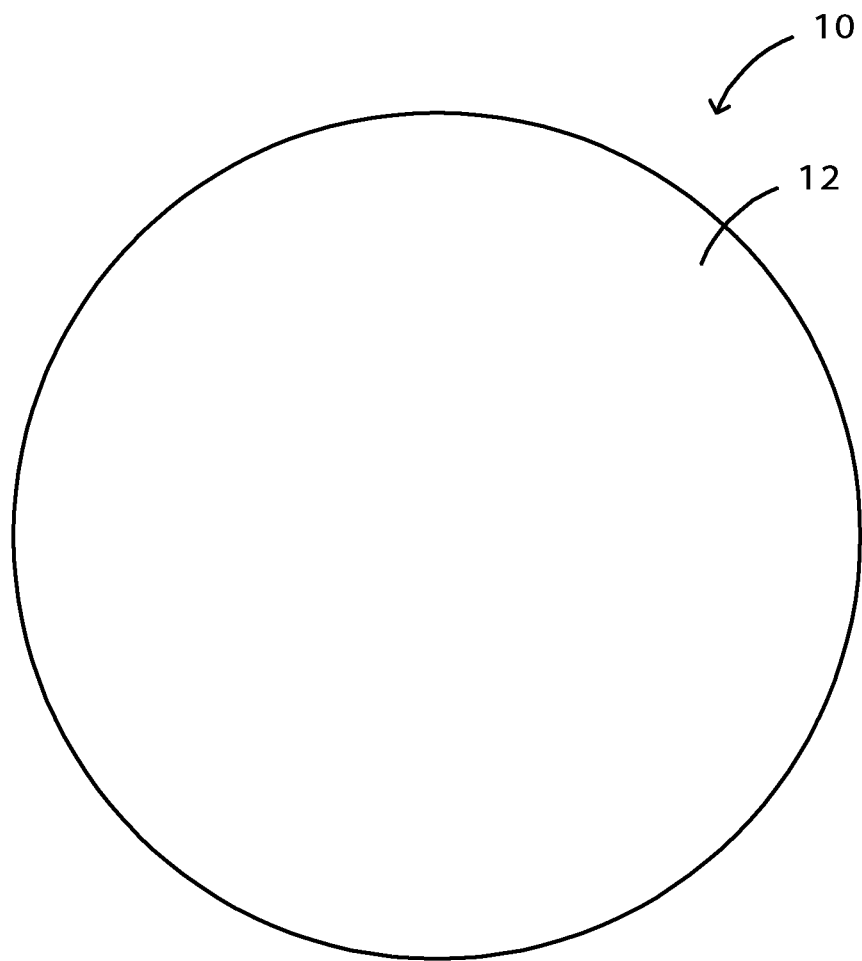
FIG. 1 is a plan view showing a ceramic heater 10.

In a method for producing a ceramic heater according to the present invention, the low-temperature sinterable raw material powder is a powder mixture containing aluminum nitride powder as a main component and 0.03% to 1% by weight of rare earth oxide powder. Examples of the rare earth oxide include yttria ($Y_2O_3$), samaria ($Sm_2O_3$), and europia ($Eu_2O_3$). When the content of the rare earth oxide powder is less than 0.03% by weight, thermal conductivity after sintering becomes excessively low, thus degrading uniformity of heating, which is undesirable. When the content of the rare earth oxide powder exceeds 1% by weight, sinterability significantly decreases, thus degrading uniformity of heating, which is undesirable.

In the method for producing a ceramic heater according to the present invention, the metal meshes may be, for example, composed of molybdenum, tungsten, or the like. Among these, molybdenum is preferable. Preferably, the metal meshes are composed of a material obtained by knitting metal wires having a diameter of 0.1 to 0.2 mm. When the diameter of metal wires is less than 0.1 mm, the metal wires are too thin and it is difficult to cut out a plate-like metal mesh into a desired shape using laser machining, which is undesirable. When the diameter of metal wires exceeds 0.2 mm, electrical resistance may become too low and the resulting heater may not function satisfactorily, which is undesirable. Furthermore, it is also conceivable to fabricate resistive heating elements by printing using a conductive paste. In such a case, it is very difficult to fabricate the resistive heating elements so as to have an electrical resistance as designed, and it is not possible to enhance uniformity of heating on the heating surface.

In the method for producing a ceramic heater according to the present invention, the outer layers are composed of aluminum nitride sintered bodies having a volume resistivity of $10^{15}$ Ωcm or more. In the case where the volume resistivity is less than $10^{15}$ Ωcm, when current is passed through the resistive heating elements, there is a possibility that the current may leak to wafers or RF electrodes or the like embedded in the vicinity of the surface, thus causing unstable plasma on the wafer. Such aluminum nitride sintered bodies may be obtained, for example, by firing a shaped body composed of high-temperature sinterable raw material powder containing aluminum nitride powder and 4% to 7% by weight of rare earth oxide powder at 1,800° C. to 1,900° C.

In the method for producing a ceramic heater according to the present invention, firing is performed at 1,600° C. to 1,750° C. in a state in which front and back surfaces of an inner shaped body are sandwiched between a pair of outer layers composed of aluminum nitride sintered bodies through resistive heating elements. When the firing temperature is less than 1,600° C., since the inner sintered body does not become dense, thermal conductivity becomes excessively low, strength is decreased, and uniformity of heating degrades, which are undesirable. When the firing temperature exceeds 1,750° C., the volume resistivity of the sintered inner portion significantly decreases, and the rate of change in resistance of the resistive heating elements significantly increases, resulting in increase in leakage current and degradation in uniformity of heating, which are undesirable. Furthermore, the inner shaped body may be shaped before being sandwiched between a pair of outer layers, or raw material powder may be formed into a shaped body by being sandwiched between a pair of outer layers in a die and being pressed.

In the method for producing a ceramic heater according to the present invention, preferably, before the inner shaped body is sandwiched between the outer layers, a groove having a shape that matches the shape of its corresponding resistive heating element is formed in each of the outer layers, and the resistive heating element is fitted into the groove. In such a manner, positioning of the resistive heating elements can be performed reliably and easily.

A ceramic heater produced by the method for producing a ceramic heater according to the present invention includes a substrate composed of an aluminum nitride sintered body containing a rare earth element, a first resistive heating element composed of a metal mesh disposed in the substrate at the vicinity of the front surface thereof, and a second resistive heating element composed of a metal mesh disposed in the substrate at the vicinity of the back surface thereof.

In the ceramic heater, when the resistive heating elements are heated to 700° C., the difference between maximum and minimum temperatures on the heating surface of the substrate is 5° C. or less, and preferably 3° C. or less. Furthermore, in the ceramic heater, the sintered body of the inner shaped body has a smaller amount of a rare earth element, a smaller crystal grain size, and a higher carbon content than the outer layers. Conventionally, when raw material powder containing only 1% by weight or less of $Y_2O_3$ is sintered, the volume resistivity of the resulting aluminum nitride sintered body is usually low at $10^{10}$ to $10^{12}$ Ωcm. Consequently, problems occur; for example, leakage current occurs, and a sufficient amount of heat generation cannot be obtained. However, in the ceramic heater obtained by the method for producing a ceramic heater according to the present invention, although raw material powder containing only 1% by weight or less of $Y_2O_3$ is sintered, occurrence of leakage current is not observed. The reason for this is believed to be that by firing low-temperature sinterable raw material powder while being covered with dense outer sintered bodies, scattering of carbon is suppressed in the sintering step, the crystal grain size of the inner sintered body is decreased, and the carbon content is increased.

Figure 2:
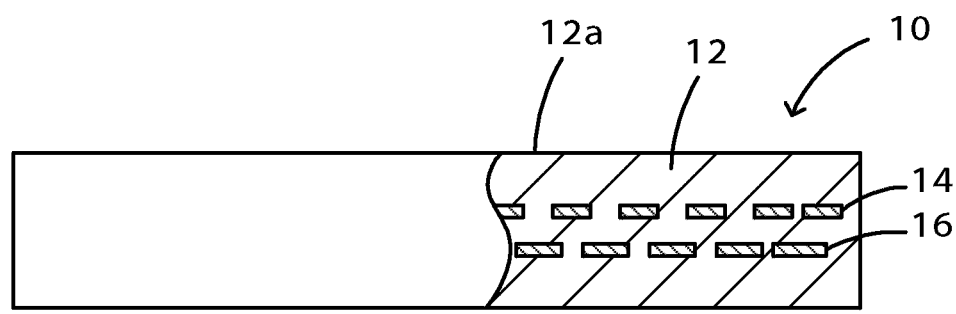
FIG. 2 is a front view (cross-sectional view) of the ceramic heater 10.
Figure 3:
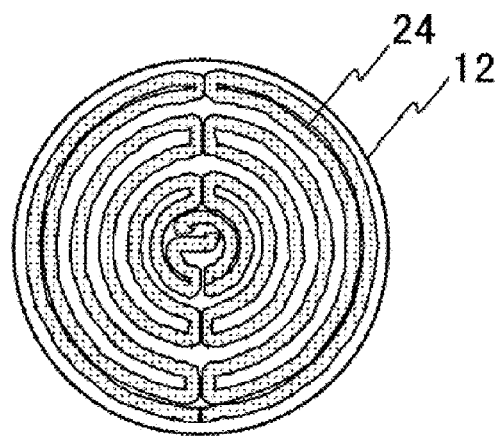
FIG. 3 is a view schematically showing a first projection pattern 24.
Figure 4:
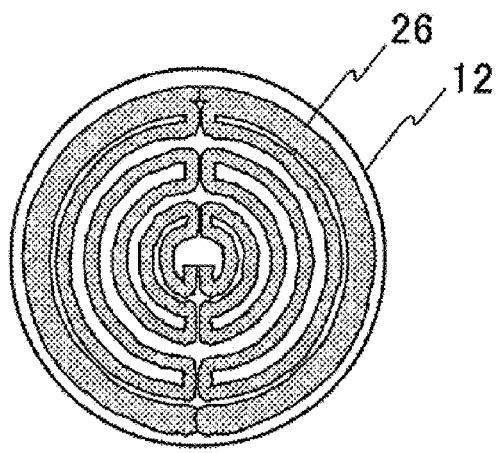
FIG. 4 is a view schematically showing a second projection pattern 26.
Figure 5:
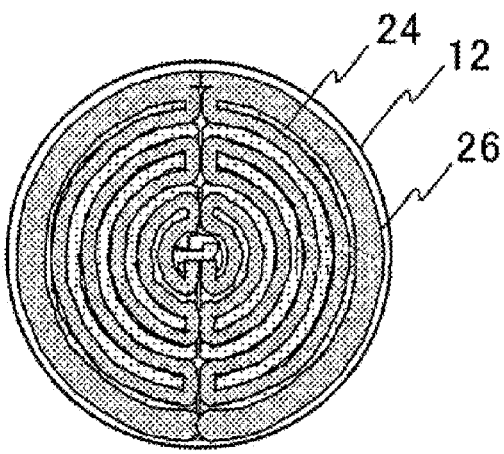
FIG. 5 is a view schematically showing a state in which the first and second projection patterns 24 and 26 overlap.

FIG. 1 is a plan view showing a ceramic heater 10 according to an embodiment of the present invention, and FIG. 2 is a front view (cross-sectional view) of the ceramic heater 10. The ceramic heater 10 includes a substrate 12 composed of an aluminum nitride sintered body containing a rare earth element, a first resistive heating element 14 composed of a molybdenum mesh disposed in the substrate 12 at the vicinity of the front surface thereof, and a second resistive heating element 16 composed of a molybdenum mesh disposed in the substrate 12 at the vicinity of the back surface thereof. The size of the substrate 12 is not particularly limited. For example, the substrate 12 has a diameter of 330 to 340 mm and a thickness of 20 to 30 mm. FIG. 3 shows a first projection pattern 24 in which the first resistive heating element 14 is projected on a heating surface 12a of the substrate 12. As shown in FIG. 3, in the first resistive heating element 14, two terminals are disposed in the vicinity of the center, and wiring is arranged so as to extend and traverse from one terminal to the other terminal. FIG. 4 shows a second projection pattern 26 in which the second resistive heating element 16 is projected on the heating surface 12a of the substrate 12. As shown in FIG. 4, in the second resistive heating element 16, two terminals are disposed in the vicinity of the center, and wiring is arranged so as to extend and traverse from one terminal to the other terminal. FIG. 5 shows a state in which the first and second projection patterns 24 and 26 overlap. As is evident from FIG. 5, the second projection pattern 26 overlies the gaps of the first projection pattern 24. That is, when the first resistive heating element 14 only is used, temperature variation easily occurs on the heating surface 12a. In order to make up for this, the second resistive heating element 16 is formed in the shape described above. In addition, the first and second resistive heating elements 14 and 16 may be formed such that the first and second projection patterns 24 and 26 fitted into each other when superposed.

Figure 6:
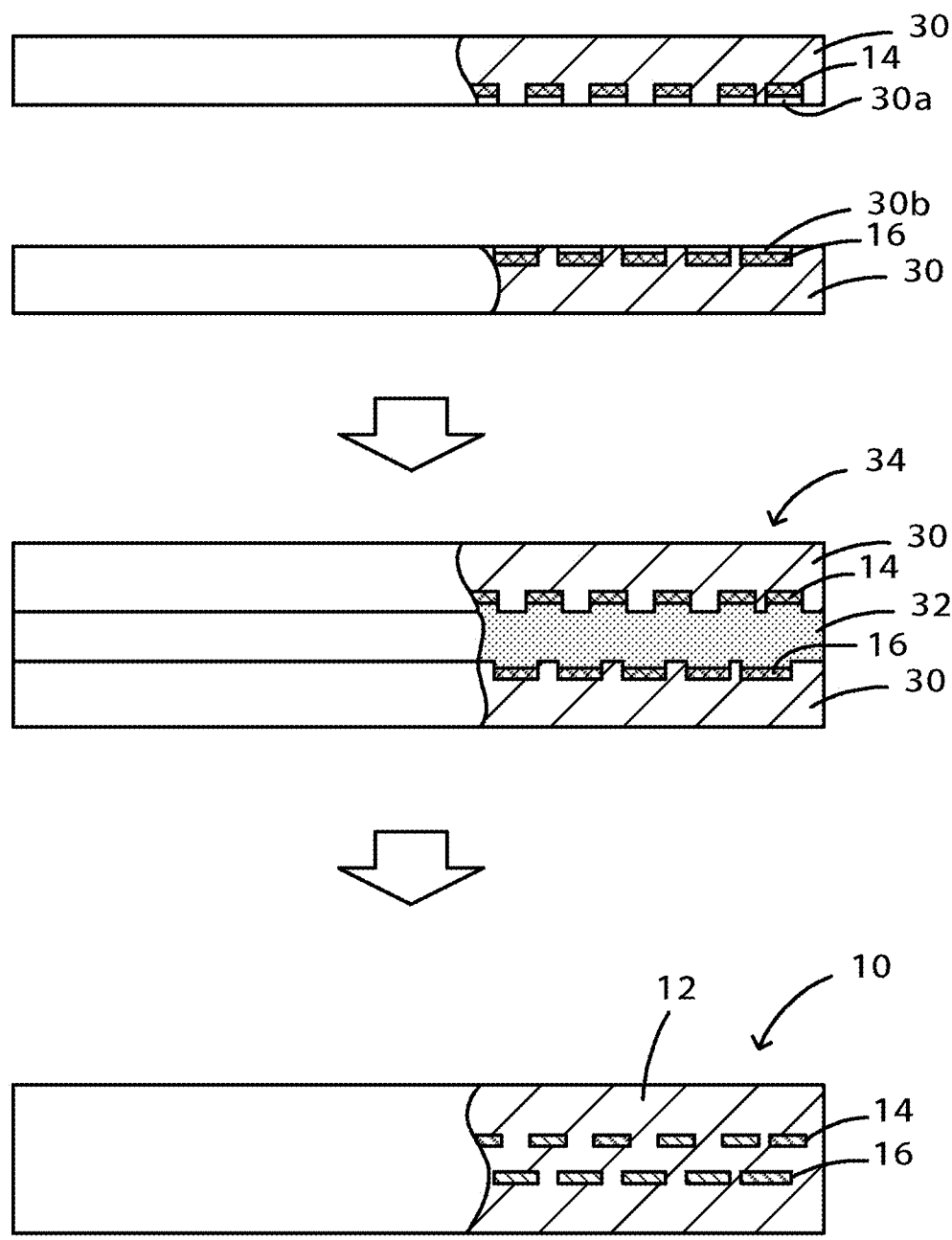
FIG. 6 is a view schematically showing manufacturing steps of a ceramic heater 10.

Next, a method for producing such a ceramic heater 10 will be described. FIG. 6 is a view schematically showing manufacturing steps of the ceramic heater 10. First, two outer layers 30 are formed. The outer layers 30 are obtained by mixing aluminum nitride powder and rare earth oxide powder in an amount of 4% to 7% by weight relative to the aluminum nitride powder, and press-forming the resulting powder mixture into outer shaped bodies. The outer shaped bodies are sintered by hot pressing at 1,800° C. to 1,900° C. to form the outer layers 30. When the individual powders are mixed, for example, the individual powders may be subjected to wet mixing in an organic solvent to form a slurry, and the slurry may be dried and granulated to obtain a powder mixture. In the wet mixing process, a grinder, such as a pot mill, a trammel, or an attrition mill, may be used. Instead of wet mixing, dry mixing may be performed. When the powder mixture is press-formed into outer shaped bodies, preferably, the powder mixture is subjected to uniaxial pressing. In uniaxial pressing, the powder mixture is charged in a die, and forming is performed under vertically applied pressure. Thus, a high-density shaped body can be obtained. Furthermore, uniaxial pressing is suitable for the case where high dimensional accuracy is required. When the outer shaped bodies are sintered by hot pressing, for example, hot-press firing may be performed in a vacuum or inert atmosphere at a pressing pressure of 50 to 300 kgf/cm$^2$. The firing time can be set appropriately depending on the firing conditions. For example, the firing time may be set appropriately in a range of 1 to 10 hours. The inert atmosphere may be a gas atmosphere that does not affect firing, and for example, a nitrogen atmosphere or an argon atmosphere may be used. By introducing the inert atmosphere, uniformity of heating is further enhanced, in particular, when a large sintered body is obtained, and a uniform sintered body can be obtained. The volume resistivity of the outer layers 30 thus obtained is $1 \times 10^{15}$ Ωcm or more.

Next, a groove 30a having a shape that matches the shape of the first resistive heating element 14 is formed on a surface of the outer layer 30, and the first resistive heating element 14 is fitted into the groove 30a. Furthermore, a groove 30b having a shape that matches the shape of the second resistive heating element 16 is formed on a surface of the other outer layer 30, and the second resistive heating element 16 is fitted into the groove 30b.

Next, 0.03% to 1% by weight of rare earth oxide powder is added to aluminum nitride powder, and mixing is performed to prepare a powder mixture (low-temperature sinterable raw material powder). The powder mixture can be prepared and press-formed as in the outer shaped bodies. The outer layer 30 having the second resistive heating element 16 fitted into the groove 30b is set in a forming die such that the second resistive heating element 16 faces upward, and then the low-temperature sinterable raw material powder which has been prepared is charged therein. Then, the outer layer 30 having the first resistive heating element 14 fitted into the groove 30a is set such that the first resistive heating element 14 faces the low-temperature sinterable raw material powder, and press-forming is performed at a pressure of 50 to 100 kg/cm$^2$. Thereby, a shaped body 34 having a sandwich structure is obtained in which the outer layer 30 having the first resistive heating element 14 fitted therein and the outer layer 30 having the second resistive heating element 16 fitted therein are disposed, respectively, on the front surface and the back surface of the inner shaped body 32 having a thickness of 3 to 20 mm (preferably 5 to 15 mm) such that the resistive heating elements 14 and 16 face the inner shaped body 32.

Next, the shaped body 34 having the sandwich structure is set in a die for hot pressing and subjected to low-temperature sintering at 1,600° C. to 1,750° C. by hot pressing. A ceramic heater 10 is thereby obtained. In this stage, low-temperature sintering may be performed, for example, in a vacuum or inert atmosphere at a pressing pressure of 50 to 300 kgf/cm$^2$. The firing time can be set appropriately depending on the firing conditions. For example, the firing time may be preferably set in a range of 2 to 4 hours.

The resulting ceramic heater 10 has a substrate 12, and the substrate 12 is a body including the inner shaped body 32 and the outer layers 30 integrated by sintering. Specifically, the substrate 12 includes an intermediate sintered body formed by low-temperature sintering of the inner shaped body 32, and a pair of outer sintered bodies (originating from the outer layers 30) sandwiching the intermediate sintered body (refer to FIG. 7). The intermediate sintered body contains a smaller amount of a rare earth element (a component derived from a rare earth oxide) than the outer sintered bodies, and has a crystal grain size of 1 to 2 μm and a carbon content of 300 to 600 ppm (by weight). The outer sintered bodies contain a rare earth element (a component derived from a rare earth oxide), and has an average grain size of 5 to 7 μm and a carbon content of 200 to 400 ppm (by weight), the carbon content being lower than the carbon content of the intermediate sintered body. Furthermore, the first and second resistive heating elements 14 and 16 contain the molybdenum phase and the molybdenum carbide phase after being subjected to low-temperature sintering. However, with respect to the molybdenum carbide phase which has a high resistance and a large amount of heat generation, the amount of the molybdenum carbide phase formed is small because of low temperature, and the molybdenum carbide phase is not conspicuously unevenly distributed in the first resistive heating element 14. As a result, in the first and second resistive heating elements 14 and 16, the resistance does not largely vary over the entire length, and the resistance distribution in the resistive heating elements can be maintained as designed. Thus, the difference between maximum and minimum temperatures on the heating surface of the ceramic heater 10 can be set in a range of 5° C. or less. Furthermore, when current is passed through the first and second resistive heating elements 14 and 16, leakage current does not occur. Consequently, in spite of the fact that the sintered body between the first and second resistive heating elements 14 and 16 is obtained by sintering the inner shaped body 32 composed of raw material powder containing only 1% by weight or less of $Y_2O_3$, a high volume resistivity of about $10^{15}$ Ωcm is exhibited.

EXAMPLES

Example 1

First, two outer layers 30 with a diameter of 360 mm and a thickness of 6 mm were formed. That is, 5% by weight of yttria powder having an average grain size of 1.5 μm and a purity of 99.9% was added to aluminum nitride powder having an average grain size of 1 μm and a purity of 99.9%, and mixing was performed. The resulting powder mixture was subjected to uniaxial pressing at 100 kgf/cm² to form outer shaped bodies. The outer shaped bodies were sintered by hot pressing to obtain the outer layers 30. The sintering was performed in a nitrogen atmosphere, at a pressing pressure of 200 kgf/cm², at 1,820° C., for two hours. The resulting outer layers 30 had a volume resistivity of $2 \times 10^{15}$ Ωcm. Note that the volume resistivity was measured according to JIS C2141 (test method of ceramic materials for electrical insulation) by cutting a sample from an aluminum nitride sintered body formed under the same conditions.

Next, a groove 30a having a shape that matched the shape of the first resistive heating element 14, with a width of 6 mm (excluding some parts), was formed by blasting on a surface of one of the outer layers 30. The depth of the groove 30a was 0.5 mm. The blasting was performed using abrasive grains composed of silicon carbide with grain size #600. Meanwhile, a plate-like molybdenum mesh with a thickness of 0.24 mm obtained by knitting molybdenum wires having a diameter of 0.12 mm was prepared, and a first resistive heating element 14 was cut out from the molybdenum mesh by laser machining and fitted into the groove 30a of the outer layer 30. The other outer layer 30 was also processed in the same manner, and the second resistive heating element 16 with a width of 9 mm (excluding some parts) was fitted into the groove 30b of the outer layer 30.

Next, 0.03% by weight of yttria powder having an average grain size of 1.5 μm and a purity of 99.9% was added to aluminum nitride powder having an average grain size of 1 μm and a purity of 99.9%, and mixing was performed to prepare a powder mixture (low-temperature sinterable raw material powder). The outer layer 30 having the second resistive heating element 16 fitted into the groove 30b was set in a forming die such that the second resistive heating element 16 faced upward, and then the low-temperature sinterable raw material powder which had been prepared was charged therein. Then, the outer layer 30 having the first resistive heating element 14 fitted into the groove 30a was set such that the first resistive heating element 14 faced the low-temperature sinterable raw material powder, and press-forming was performed at a pressure of 100 kg/cm². Thereby, a shaped body 34 having a sandwich structure was obtained in which the front and back surfaces of the inner shaped body 32 with a thickness of 6 mm was sandwiched between a pair of outer layers 30.

Next, the shaped body 34 having the sandwich structure was set in a die for hot pressing, the die having cylinders inserted in the upper and lower portions of a carbon sagger, and the shaped body 34 was subjected to low-temperature sintering by hot pressing. A ceramic heater 10 was thereby obtained. The low-temperature sintering was performed in a nitrogen atmosphere, at a pressing pressure of 100 kgf/cm², at 1,650° C., for two hours. The thickness of the inner shaped body 32 after the low-temperature sintering was about a half of the thickness before the low-temperature sintering.

In order to evaluate the temperature uniformity of the heating surface, the rate of rise in resistance and temperature distribution were measured for the resulting ceramic heater 10. The rate of rise in resistance was measured as follows. With respect to the first resistive heating element 14, a first point in which the designed electrical resistance had a value R0 from one of two terminals in the vicinity of the center was set, and a second point in which the designed electrical resistance had a value R0 from the first point was set. In such a manner, setting was made up to an eighth point. With respect to the second resistive heating element 16, first to eighth points were set in the same manner. In the first resistive heating element 14, electrical resistances between the center terminal and the first point, between the first point and the second point, . . . , between the seventh point and the eighth point were measured. In the second resistive heating element 16, electrical resistances between the center terminal and the first point, between the first point and the second point, . . . , between the seventh point and the eighth point were measured. With respect to each of the measured values of electrical resistance, 100×(measured value−designed value R0)/designed value R0 was calculated, and the maximum value was considered as the rate of rise in resistance (%). The results are shown in Table 1.

The temperature distribution was measured as follows. Electrode terminals (not shown) were connected to two terminals in the vicinity of the center of the first resistive heating element 14, and electrode terminals (not shown) were connected to two terminals in the vicinity of the center of the second resistive heating element 16, and by applying current between the resistive heating elements 14 and 16, the temperature of the heating surface 12a was controlled so that a target temperature of 700° C. was achieved. When the temperature reached the target temperature of 700° C. and stabilized, the temperature of the entire surface of the heating surface 12a was measured, and the difference between maximum and minimum temperatures was calculated. This was considered as the temperature distribution (° C.). The results are shown in Table 1. As is evident from Table 1, the rate of rise in resistance was only 6%, and the temperature distribution was only 3° C. Note that the temperature distribution was measured using an infrared thermometer.

Examples 2 to 5, Comparative Examples 1 to 3

In Examples 2 to 5, ceramic heaters 10 were produced as in Example 1 under the conditions shown in Table 1, and the rate of rise in resistance and temperature distribution of the ceramic heaters 10 were measured. In Comparative Example 1, the first and second resistive elements 14 and 16 were embedded in the shaped body composed of aluminum nitride containing 0.1% by weight of yttria, and sintering was performed at a high temperature of 1,855° C. Thereby, a ceramic heater composed of an aluminum nitride sintered body in which the entire ceramic contained 0.1% by weight of yttria was produced. The rate of rise in resistance and temperature distribution of the ceramic heater were measured. In each of Comparative Examples 2 and 3, the inner shaped body 32 was composed of aluminum nitride powder containing 5% by weight of yttria, and sandwiched between the outer layers 30 composed of aluminum nitride sintered bodies containing 5% by weight of yttria to form the shaped body 34 having a sandwich structure. The shaped body 34 was sintered at a high temperature of 1,820° C. Thereby, a ceramic heater was produced. The rate of rise in resistance and temperature distribution of the ceramic heater were measured. The results are shown in Table 1.

TABLE 1

|  | Used amount of $Y_2O_3$ (% by weight) | Width of resistive heating element | | Thickness of inner shaped body (mm) | Firing temperature (°C.) | Rate of rise in resistance (%) | Temperature distribution (°C.) |
| --- | --- | --- | --- | --- | --- | --- | --- |
|  |  | First (mm) | Second (mm) |  |  |  |  |
| Example 1 | 0.03 | 6 | 9 | 6 | 1650 | 6 | 3 |
| Example 2 | 0.05 | 6 | 9 | 6 | 1650 | 5 | 2 |
| Example 3 | 0.10 | 6 | 9 | 6 | 1650 | 5 | 2 |
| Example 4 | 0.10 | 9 | 6 | 12 | 1650 | 5 | 2 |
| Example 5 | 1.00 | 6 | 9 | 6 | 1650 | 6 | 2 |
| Comparative Example 1 | 0.10 | 6 | 9 | 6 | 1855 | 38 | 10 |
| Comparative Example 2 | 5 | 6 | 9 | 6 | 1820 | 35 | 7 |
| Comparative Example 3 | 5 | 9 | 6 | 12 | 1820 | 35 | 8 |

As is evident from Table 1, in each of Examples 1 to 5, the rate of rise in resistance was very low at 5% to 6%, and the temperature distribution was very low at 2° C. to 3° C. In contrast, in each of Comparative Examples 1 to 3, the rate of rise in resistance was high at 35% to 38%, and the temperature distribution was high at 7° C. to 10° C., indicating poor uniformity of heating. Furthermore, in Examples 1 to 5, since leakage current did not occur between the first resistive heating element 14 and the second resistive heating element 16, the volume resistivity therebetween was expected to be about $10^{15}$ Ωcm. In fact, when the volume resistivity was measured, as shown in Table 2 below, this expectation was accurate.

Figure 7:
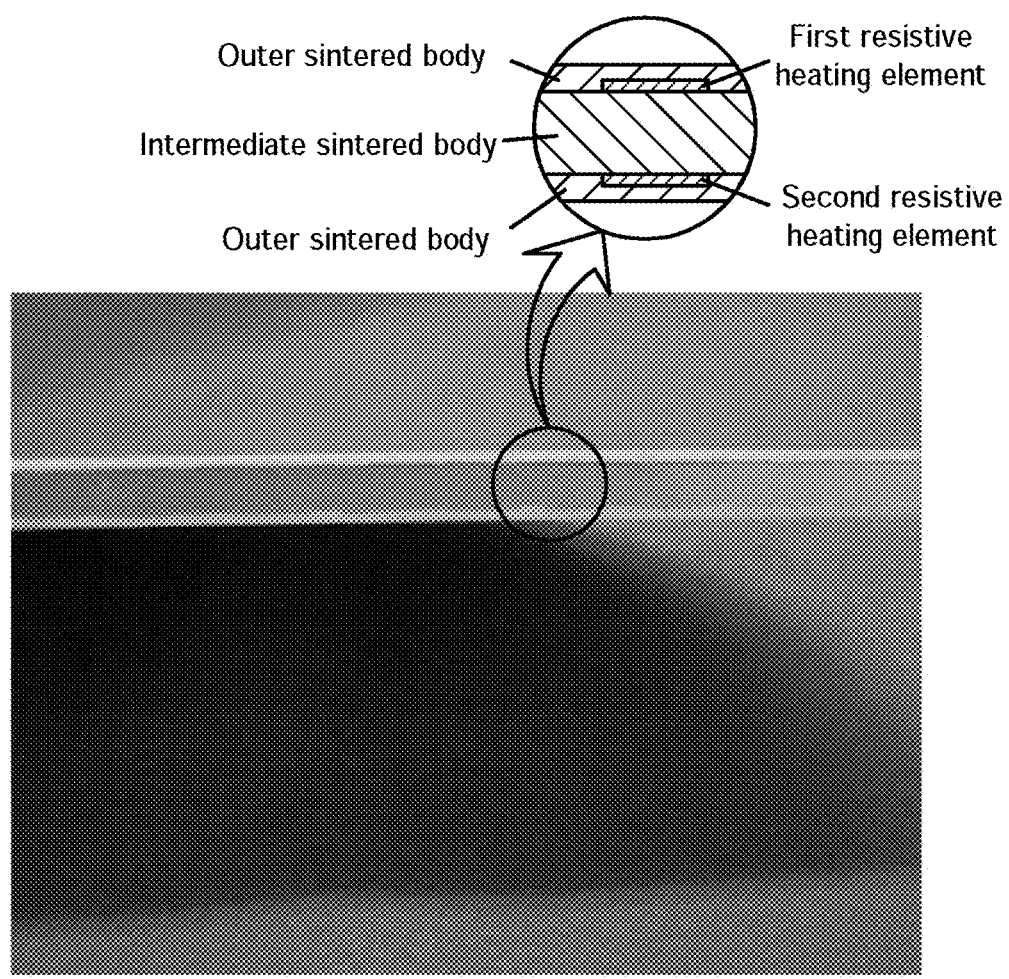
FIG. 7 shows a photograph of a cross-section of a ceramic heater of Example 4 (including a partial enlarged view)

FIG. 7 shows a photograph of a cross-section of a ceramic heater of Example 4 (including a partial enlarged view). In the photograph of FIG. 7, whitish portions are outer sintered bodies corresponding to outer layers 30 before the low-temperature sintering step. Meanwhile, a dark gray portion sandwiched between a pair of outer sintered bodies is an intermediate sintered body corresponding to the inner shaped body 32 before the low-temperature sintering step. That is, the inner shaped body 32 and a pair of outer sintered bodies sandwiching the inner shaped body 32 correspond to the substrate 12. Although distinction is difficult in the photograph, the first and second resistive heating elements are present in the vicinity of interfaces between the intermediate sintered body and the outer sintered bodies.

Figure 8:
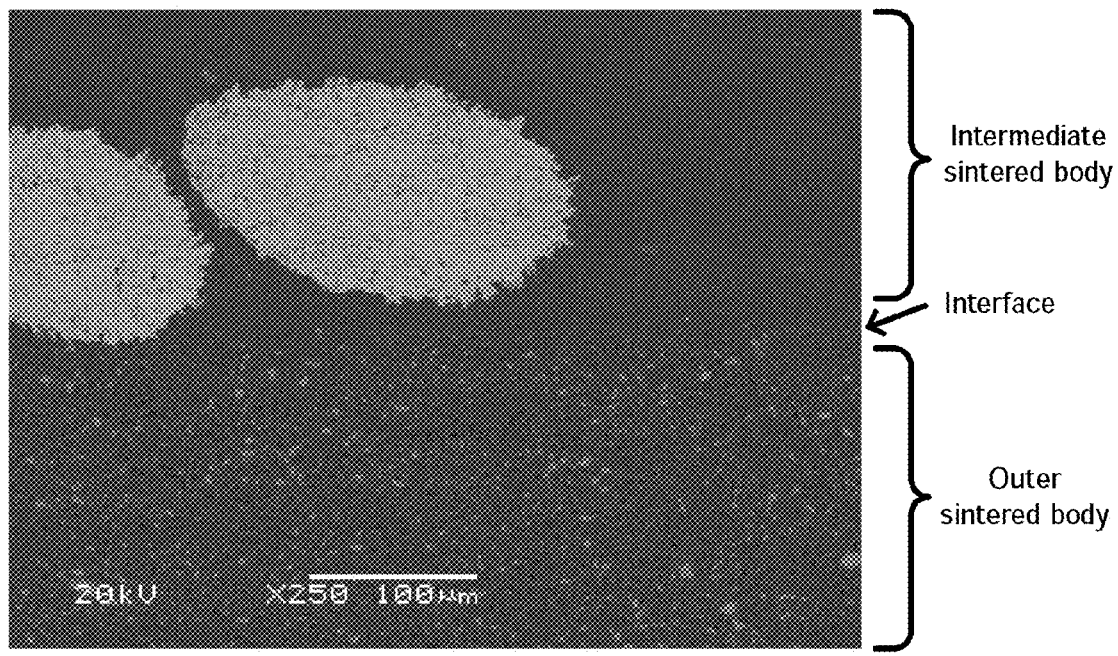
FIG. 8 shows a photograph of a back-reflection electron image (BEI) of the ceramic heater of Example 4.
Figure 9:
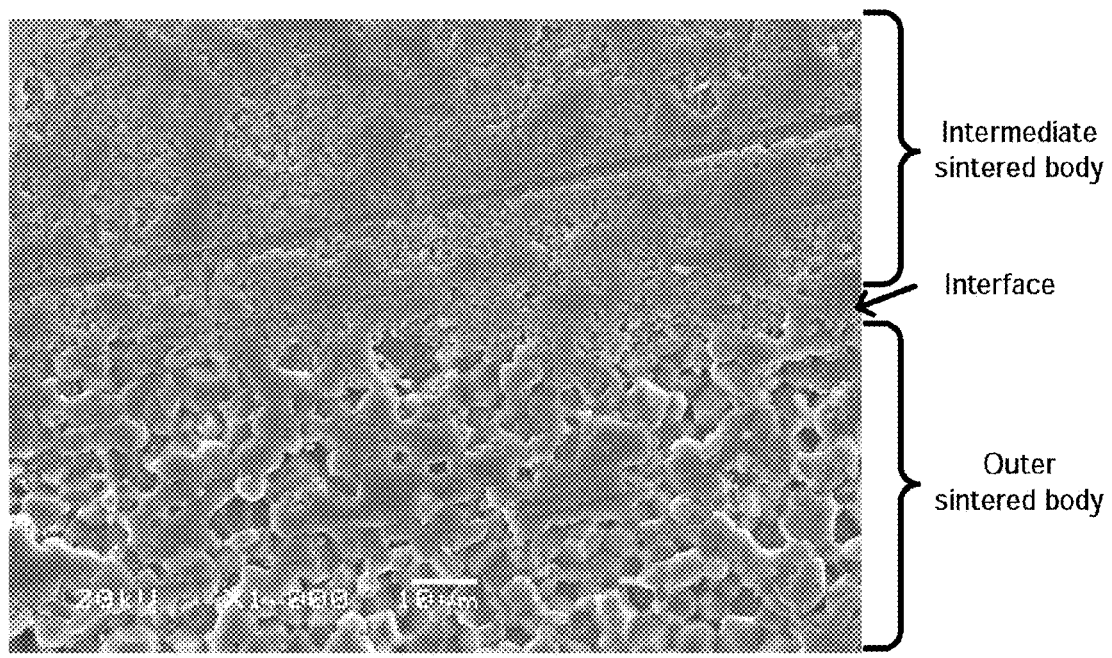
FIG. 9 shows a photograph of a secondary electron image (SEI) of the ceramic heater of Example 4.

With respect to the ceramic heater of Example 4, a back-reflection electron image (BEI) and a secondary electron image (SEI) of the interface between the intermediate sintered body and the outer sintered body and its vicinity were photographed, and the microstructure was examined. In general, BEI is suitable for observing the composition, and SEI is suitable for observing the crystalline shape. FIG. 8 shows a photograph of BEI, and FIG. 9 shows a photograph of SEI. In FIG. 8, the whitish elliptic portions are cross-sections of the molybdenum mesh. FIGS. 8 and 9 show photographs of different parts. In FIG. 8, Y appears as whitish points, and such whitish points scatter only in the outer sintered body which is located in the lower half of the image and are not observed in the intermediate sintered body which is located in the upper half of the image.

With respect to Examples 1 to 5 and Comparative Examples 1 to 3, the carbon content (by weight), the average crystal grain size, and the volume resistivity were measured. The results are shown in Table 2. The carbon content was measured using high frequency heating-infrared absorbing analysis according to JIS R1603. The average crystal grain size was defined as the average value of a plurality of grain sizes of crystals in the SEI photograph. The volume resistivity was measured as in the volume resistivity of the outer layers 30 in Example 1. In Examples 1 to 5, the average crystal grain size of the intermediate sintered body was 1 to 2 μm, and the average crystal grain size of the outer sintered body was 5 to 7 μm. Furthermore, the carbon content of the intermediate sintered body was 300 to 600 ppm, and the carbon content of the outer sintered body was 200 to 400 ppm. The carbon content of the intermediate sintered body was about 100 to 200 ppm higher than the carbon content of the outer sintered body. Furthermore, the volume resistivity of the intermediate sintered body was $8 \times 10^{14}$ to $1 \times 10^{15}$ Ωcm.

TABLE 2

|  | Carbon content (ppm) | | Crystal grain size (μm) | | Volume resistivity (Ωcm) | |
| --- | --- | --- | --- | --- | --- | --- |
|  | Intermediate sintered body | Outer sintered body | Intermediate sintered body | Outer sintered body | Intermediate sintered body | Outer sintered body |
| Example 1 | 320 | 200 | 2 | 6 | $8 \times 10^{14}$ | $2 \times 10^{15}$ |
| Example 2 | 340 | 220 | 1.8 | 7 | $8 \times 10^{14}$ | $2 \times 10^{15}$ |
| Example 3 | 440 | 280 | 1.4 | 6 | $9 \times 10^{14}$ | $2 \times 10^{15}$ |
| Example 4 | 460 | 320 | 1.2 | 7 | $1 \times 10^{15}$ | $2 \times 10^{15}$ |
| Example 5 | 580 | 380 | 1 | 5 | $1 \times 10^{15}$ | $2 \times 10^{15}$ |
| Comparative Example 1 | 200 | | 6 | | $2 \times 10^{15}$ | |
| Comparative Example 2 | 180 | | 7 | | $1 \times 10^{15}$ | |
| Comparative Example 3 | 160 | | 7 | | $3 \times 10^{12}$ | |

As described above, as a result of examination of the distribution of Y, the crystal grain size and the carbon content (by weight) of the individual sintered bodies, it has been concluded that the reason for the increase in the volume resistivity of the intermediate sintered body is that the crystal grain size is 1 to 2 µm and the carbon content is 300 to 600 ppm (by weight). Specifically, when a powder mixture including aluminum nitride powder and 0.1% by weight of yttria powder is shaped and the shaped body is directly fired, the volume resistivity is low only at $10^{10}$ to $10^{12}$ Ωcm. However, in Examples 1 to 5, it is believed that, since the powder mixture is sandwiched between a pair of outer layers and fired, CO gas and the like are not removed from the powder mixture, a large amount of the carbon component remains, and the remaining carbon component inhibits grain growth, resulting in a small crystal grain size of 1 to 2 µm and a high volume resistivity (about $10^{15}$ Ωcm) in the intermediate sintered body.

It will be apparent that the present invention is not limited to the examples described above, and may be embodied in various forms within the technical scope of the present invention.

This application is based upon and claims the benefit of priority from the prior Japanese Patent Application No. 2009-081594 filed on Mar. 30, 2009, the entire contents of which are incorporated herein by reference.

What is claimed is:

1. A method for producing a ceramic heater comprising performing firing at 1,600° C. to 1,750° C. in a state in which front and back surfaces of an inner shaped body composed of low-temperature sinterable raw material powder containing aluminum nitride powder as a main component and 0.03% to 1% by weight of rare earth oxide powder are sandwiched between a pair of outer layers composed of aluminum nitride sintered bodies having a volume resistivity of $10^{15}$ Ωcm or more through resistive heating elements composed of metal meshes.

2. The method for producing a ceramic heater according to claim 1, wherein the pair of outer layers are obtained by firing a shaped body composed of high-temperature sinterable raw material powder containing aluminum nitride powder and 4% to 7% by weight of rare earth oxide powder at 1,800° C. to 1,900° C.

3. The method for producing a ceramic heater according to claim 2, wherein, before the inner shaped body is sandwiched between the outer layers, a groove having a shape that matches the shape of its corresponding resistive heating element is formed in each of the outer layers, and the resistive heating element is fitted into the groove.

4. The method for producing a ceramic heater according to claim 2, wherein the resistive heating elements are composed of a material obtained by knitting molybdenum wires having a diameter of 0.1 to 0.2 mm.

5. The method for producing a ceramic heater according to claim 1, wherein, before the inner shaped body is sandwiched between the outer layers, a groove having a shape that matches the shape of its corresponding resistive heating element is formed in each of the outer layers, and the resistive heating element is fitted into the groove.

6. The method for producing a ceramic heater according to claim 1, wherein the resistive heating elements are composed of a material obtained by knitting molybdenum wires having a diameter of 0.1 to 0.2 mm.

7. A ceramic heater comprising:
    an intermediate sintered body containing, as a main component, aluminum nitride and having an average crystal grain size of 1 to 2 µm and a carbon content of 300 to 600 ppm (by weight);
    first and second resistive heating elements composed of metal meshes and disposed on front and back surfaces of the intermediate sintered body; and
    a pair of outer sintered bodies containing, as a main component, aluminum nitride and having an average crystal grain size of 5 to 7 µm and a carbon content of 200 to 400 ppm (by weight), the carbon content being lower than the carbon content of the intermediate sintered body, the outer sintered bodies sandwiching the intermediate sintered body through the first and second resistive heating elements.

8. The ceramic heater according to claim 7, wherein the outer sintered bodies contain a rare earth element, and the intermediate sintered body contains a smaller amount of a rare earth element than the outer sintered bodies.

9. The ceramic heater according to claim 7, wherein the resistive heating elements are composed of a material obtained by knitting molybdenum wires having a diameter of 0.1 to 0.2 mm.

10. The ceramic heater according to claim 7, wherein, when the first and second resistive heating elements are heated to 700° C., the difference between maximum and minimum temperatures on the surface of the ceramic heater is 5° C. or less.

* * * * *